United States Patent
Patel et al.

(10) Patent No.: US 8,392,035 B2
(45) Date of Patent: Mar. 5, 2013

(54) SYSTEM AND METHOD FOR COOLING AN ELECTRONIC DEVICE

(75) Inventors: Chandrakant Patel, Fremont, CA (US); Cullen E. Bash, Los Gatos, CA (US); Ratnesh K. Sharma, Union City, CA (US)

(73) Assignee: Hewlett-Packard Development Company, L. P., Houston, TX (US)

( * ) Notice: Subject to any disclaimer, the term of this patent is extended or adjusted under 35 U.S.C. 154(b) by 128 days.

(21) Appl. No.: 13/024,159

(22) Filed: Feb. 9, 2011

(65) Prior Publication Data

US 2011/0127024 A1   Jun. 2, 2011

Related U.S. Application Data

(62) Division of application No. 11/779,624, filed on Jul. 18, 2007, now Pat. No. 7,903,409.

(51) Int. Cl.
*G05D 23/00* (2006.01)
*H05K 7/20* (2006.01)

(52) U.S. Cl. ........ 700/300; 700/278; 361/688; 361/700; 361/709; 361/716; 361/719

(58) Field of Classification Search .......... 700/276, 700/278, 299, 300; 361/688, 695–697, 700, 361/702, 703, 709, 711, 716, 719
See application file for complete search history.

(56) References Cited

U.S. PATENT DOCUMENTS

| | | | |
|---|---|---|---|
| 6,104,611 A | 8/2000 | Glover et al. | |
| 6,226,178 B1 * | 5/2001 | Broder et al. | 361/679.52 |
| 6,542,359 B2 | 4/2003 | Babcock et al. | |
| 6,724,626 B1 * | 4/2004 | Hodes et al. | 361/700 |
| 6,771,498 B2 | 8/2004 | Wang et al. | |
| 6,837,063 B1 * | 1/2005 | Hood et al. | 62/259.2 |
| 7,184,265 B2 | 2/2007 | Kim et al. | |
| 7,212,406 B2 | 5/2007 | Kaishian et al. | |
| 2003/0099091 A1 | 5/2003 | Ishikawa | |
| 2004/0002655 A1 | 1/2004 | Bolorforosh et al. | |
| 2004/0196634 A1 | 10/2004 | Mallik et al. | |
| 2004/0244397 A1 | 12/2004 | Kim | |
| 2005/0167083 A1 | 8/2005 | Belady et al. | |
| 2005/0258394 A1 | 11/2005 | Bacher et al. | |
| 2006/0002084 A1 * | 1/2006 | Wei | 361/695 |

FOREIGN PATENT DOCUMENTS

| | | |
|---|---|---|
| KR | 20-0319852 Y1 | 7/2003 |
| KR | 20060091179 A | 8/2006 |
| WO | 0190868 A2 | 11/2001 |

OTHER PUBLICATIONS

International Search Report, PCT/US2008/008720; Jan. 29, 2009.

* cited by examiner

*Primary Examiner* — Sean Shechtman

(57) ABSTRACT

A system for cooling an electronic device having a heat-generating component includes a passive cooling device having a cooling ability designed to expire after a predetermined amount of heat is absorbed from the heat-generating component and an active cooling device configured to at least one of dissipate heat generated by the heat-generating component and cool the passive cooling device, when the active cooling device is activated. The system also includes a controller configured to activate the active cooling device after a determination that a predetermined threshold condition has occurred, wherein the predetermined threshold condition is selected to occur after the passive cooling device cooling ability has substantially expired, to thereby substantially minimize power consumption of the active cooling device in cooling the heat-generating component.

14 Claims, 4 Drawing Sheets

SYSTEM AND METHOD FOR COOLING AN ELECTRONIC DEVICE

CLAIM FOR PRIORITY

This application is a divisional application of U.S. patent application Ser. No 11/779,624, filed on Jul. 18, 2007 now U.S. Pat. 7,903,409, the disclosure of which is hereby incorporated by reference in its entirety.

BACKGROUND

The housing of a portable electronic device generally defines a space in which various heat-generating components are contained. The heat-generating components are typically mounted on boards, which are themselves attached to the housing. Larger portable electronic devices, such as, laptops, are known to include conductive or phase change mechanisms, such as, heat pipes, that move heat from the heat-generating components to other locations in the electronic devices for dispersing the heat. The dispersal of heat is often enhanced through use of fans, which are configured to move air for the purpose of dissipating heat from the phase change mechanism or from the heat-generating components themselves. The larger portable electronic devices are often capable of employing heat-generating components having relatively high power densities because they are typically equipped with equipped with sufficiently large batteries to enable the fans to be operational whenever the heat-generating components are in operation.

Smaller portable electronic devices, however, are typically not equipped with phase change mechanisms or fans because they often do not include components that generate relatively large amounts of heat. Instead, the heat generated by these components is typically dissipated through the housing of the devices. As the computing power of the smaller portable electronic devices increases, however, conventional techniques for dissipating the heat generated by these components will most likely be inadequate. To dissipate the ever-increasing heat loads, the smaller portable electronic devices are likely to include powered cooling devices, such as fans. However, because the batteries contained in smaller portable electronic devices are relatively small, the additional power requirements of the powered cooling devices will negatively affect the performance of the batteries, thereby negatively affecting the performance of the electronic devices themselves.

It would therefore be beneficial to have the ability to cool relatively high power density heat-generating components in relatively small portable electronic devices, while substantially maximizing battery performance.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a method and system for cooling an electronic device and an electronic device having the cooling system. The cooling system includes both a passive cooling device, which does not require electrical energy, and an active cooling device, which requires electrical energy. The cooling system also includes a controller configured to activate the active cooling device after the passive cooling device has absorbed at least some of the heat generated by a heat-generating component of the electronic device. In one example, the controller may activate the active cooling device after a predetermined threshold condition has occurred following an initial cooling of the heat-generating component by the passive cooling device. More particularly, for instance, the controller activate the active cooling device after the controller determines that the ability of the passive cooling device to cool the heat-generating component has substantially expired.

Through implementation of the method and system disclosed herein, the amount of power required to adequately cool heat-generating components of electronic devices may substantially be minimized. Therefore, battery performance in portable electronic devices may also be substantially optimized.

Figure 1:
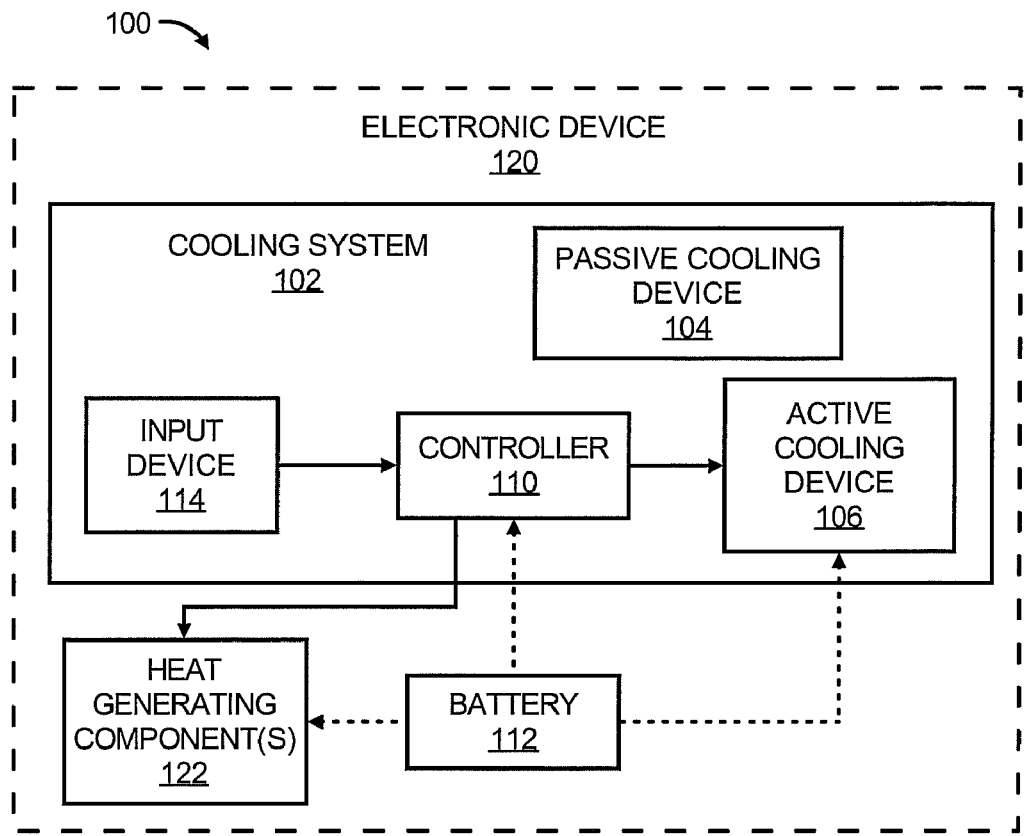
FIG. 1 shows a simplified block diagram of a system for cooling an electronic device, according to an embodiment of the invention.

With reference first to FIG. 1, there is shown a simplified block diagram 100 of a system 102 for cooling an electronic device 120 having one or more heat-generating components 122, according to an example. It should be understood that the following description of the block diagram 100 is but one manner of a variety of different manners in which such a cooling system 102 may be configured. In addition, it should be understood that the cooling system 102 may include additional components and that some of the components described herein may be removed and/or modified without departing from the scope of the cooling system 102. For instance, the cooling system 102 may include any reasonably suitable number of input devices, cooling devices, etc., as well as other components, which may be implemented in the operations of the cooling system 102. In addition, although not shown, the electronic device 120 may include additional components, such as, an input, a memory, a display, etc.

Generally speaking, the cooling system 102 is designed and configured to cool one or more heat-generating components 122, such as, processors, displays, memories, power supplies, etc., of electronic devices 120. More particularly, the cooling system 102 is configured to substantially minimize the amount of power used in adequately dissipating the heat generated by the one or more heat-generating components 122. In one regard, the energy usage is substantially minimized by activating an active cooling device 106 after a predetermined threshold condition is met, such as, when a passive cooling device 104 is no longer capable of adequately dissipating the heat generated by the heat-generating component(s) 122. The predetermined threshold condition, however, may also be based upon the temperatures of the heat-generating component(s) 122, the length of time that the heat-generating component(s) 122 have been active, etc.

As shown in FIG. 1, the cooling system 102 includes a passive cooling device 104 and an active cooling device 106. The passive cooling device 104 and the active cooling device 106 are configured to dissipate heat generated by one or more of the heat-generating components 122. The passive cooling device 104 is configured to dissipate heat generated by the heat-generating component(s) 122 without requiring electrical power. In this regard, the passive cooling device 104 may comprise, for instance, a phase change material ("PCM") that is configured to change phase from a solid to a liquid or from a liquid to a gas at a predetermined temperature.

The PCM generally operates to dissipate heat generated by the heat-generating component(s) 122 by absorbing the heat by changing phase. As such, the ability of the passive cooling device 104 to cool the heat-generating component(s) 122 is designed to expire after a predetermined amount of heat is absorbed from the heat-generating component(s) 122. In other words, for instance, the materials forming the PCM contained in the passive cooling device 104 may be selected such that the PCM changes phase at a predicted rate depending upon the amount of heat known to be generated by the heat-generating components(s) 122.

In addition or alternatively to the PCM, the passive cooling device 104 may include a heat sink into which cooling fluid is conveyed. The cooling fluid may comprise the PCM or another reasonably suitable material capable of absorbing heat from a heat source, the heat-generating component(s) 122, and conveying it to a heat sink. By way of example, the cooling fluid may comprise, a refrigerant, water, water at reduced pressure, Fluourinert™, etc. Again, the ability of the passive cooling device 104 to cool the heat-generating component(s) 122 is designed to expire after a predetermined amount of heat has been removed from the heat-generating component(s) 122.

The active cooling device 106 generally comprises an electrically-powered cooling mechanism. Examples of suitable active cooling devices 106 include, for instance, air movers, such as, blowers, fans, vortex generators, etc., refrigeration systems, such as, a solid-state thermoelectric device, etc. In the example where the active cooling device 106 comprises an air mover, the active cooling device 106 may be configured and arranged to cool the heat-generating component(s) 122 directly by causing air to flow over or around the heat-generating component(s) 122. In addition, or alternatively, the active cooling device 106 may be configured and arranged to cool the heat generating component(s) 122 indirectly by causing air to flow over, for instance, the fins of a heat sink, where the heat sink is configured to receive cooling heated by the heat-generating component(s) 122. As a yet further example, the active cooling device 106 may be configured and arranged to indirectly cool the heat-generating component(s) 122 by cooling the passive cooling device 104 either directly or indirectly.

In the example where the active cooling device 106 comprises a refrigeration system, the active cooling device 106 may include one or more cold plates through which refrigerant flows. The heated refrigerant may be cooled, for instance, through implementation of a condenser, such as, a heat sink having fins, and a fan configured and arranged to dissipate heat from the heat sink. In this example, the cold plate(s) may be attached directly to the heat-generating component(s) 122 and the refrigerant may absorb the heat generated by the heat-generating component(s) 122 as it flows through the cold plate(s). In addition, or alternatively, the cold plate(s) may be attached to the passive cooling device 104, in which case, the refrigerant may absorb heat from the passive cooling device 104.

In any of the examples above, the active cooling device 106 may be controlled by a controller 110. The controller 110 may comprise a computing mechanism, such as, for instance, a microprocessor, a micro-controller, an application specific integrated circuit (ASIC), and the like, configured to perform various processing functions. In addition, or alternatively, the controller 110 may comprise software operating in any of a number of computing mechanisms, such as a processor of the electronic device 120. The controller 110 may further be configured to perform other processing functions in addition to the cooling function described herein.

The controller 110 may communicate with a memory (not shown) configured to provide storage of software, algorithms, and the like, that provide the functionality of the controller 110. The memory may be implemented as a combination of volatile and non-volatile memory, such as DRAM, EEPROM, MRAM, flash memory, and the like. In addition, or alternatively, the memory may comprise a device configured to read from and write to a removable media, such as, a floppy disk, a CD-ROM, a DVD-ROM, or other optical or magnetic media.

In any regard, the controller 110 is programmed to control the active cooling device 106 to substantially minimize the amount of power the active cooling device 106 draws from a battery 112. More particularly, for instance, the controller 110 is programmed to enable a sufficient amount of time to pass following a predetermined event before activating the active cooling device 106, to thereby provide the passive cooling device 104 with adequate time to cool the heat-generating component(s) 122 before electrical energy from the battery 112 is expended in operating the active cooling device 106. The controller 110 may therefore activate the active cooling device 106 after a determination that a predetermined threshold condition has occurred, where the predetermined threshold condition is selected to occur after the cooling ability of the passive cooling device 104 has substantially expired. The terms "substantially expired" is intended to include both instances where the cooling ability is about to expire and where the cooling ability has already expired.

The input device 114 may provide input to the controller 110, which the controller 110 may use in determining when to activate the active cooling device 106. The input device 114 may comprise, for instance, a timer, a temperature sensor, a combination thereof, etc. If the input device 114 comprises a timer, the timer may become initiated when the electronic device 120 is activated. By way of example, if the electronic device 120 comprises a cellular telephone, the timer may become initiated when the electronic device 120 is turned on, when the electronic device 120 is employed to place or receive a telephone call or is otherwise taken out of a standby mode, etc.

As another example, if the electronic device 120 comprises a laptop computer, a personal digital assistant, a portable game console, an MP3 player, etc., the timer may become initiated in response to a determination that the activity of the electronic device 120 has reached or exceeded a predetermined activity level. The predetermined activity level may be defined, for instance, as a level in which the heat-generating component(s) 122 in the electronic device 120 are generating sufficient heat to warrant cooling of the heat-generating component(s) 122 in addition to the cooling afforded by the passive cooling device 104.

In either example, the timer may be implemented to track the length of time the electronic device 120 is operated at or beyond a predetermined activity level. The controller 110 may receive the tracked time and may activate the active cooling device 106 in response to a predetermined amount of time expiring, as described in greater detail herein below.

If the input device 114 comprises a temperature sensor, the input device 114 may be configured and arranged to detect the temperatures of one or more heat-generating components 122, the temperature of the passive cooling device 104, the temperatures of one or more cold plates, etc. In addition, the controller 110 may receive the detected temperature from the input device 114 and may control operations of the active cooling device 106 based upon the detected temperature as described in greater detail herein below.

According to an example, the controller 110 may also be programmed to vary operations of one or more of the heat-generating components 122 to substantially reduce the amount of power the heat-generating component(s) 122 draw from the battery 112. By way of example, if the heat-generating component 122 comprises a display, the controller 110 may automatically reduce the brightness of the display, for instance, once the active cooling device 106 is activated. In this regard, the controller 110 may substantially delay or prevent activation of the active cooling device 106 by reducing the amount of heat generated by the heat-generating component(s) 122.

Figure 2A:
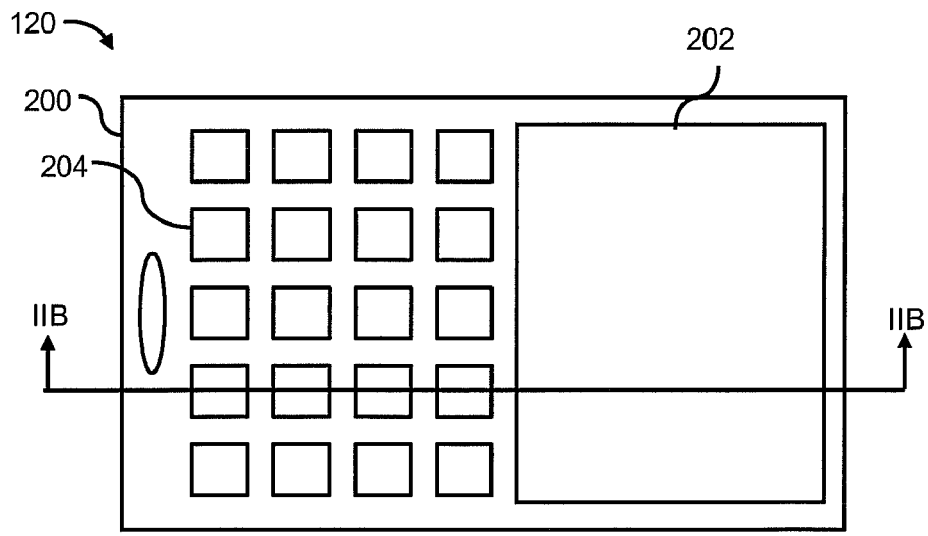
FIG. 2A shows a simplified schematic diagram of a front section of an electronic device in which the cooling system depicted in FIG. 1 may be implemented, according to an embodiment of the invention.

With reference now to FIG. 2A, there is shown a simplified schematic diagram of a front section of an electronic device 120 in which the cooling system 102 may be implemented, according to an example. It should be understood that the electronic device 120 may include additional components and that some of the components described herein may be removed and/or modified without departing from the scope of the electronic device. In addition, although particular reference is made to the electronic device 120 as comprising a cellular telephone, it should be appreciated that the following description of the electronic device 120 is applicable to various other electronic devices, such as, laptop computers, personal digital assistants, portable game consoles, portable video players, MP3 players, etc.

In the example of the electronic device 120 depicted in FIG. 2A, the electronic device 120 includes a housing 200 within which the cooling system 102 and the heat-generating components 122 are contained. The electronic device 120 is also depicted as including a display 202 and a plurality of input keys 204. The display 202 may comprise a heat-generating component 122.

Figure 2B:
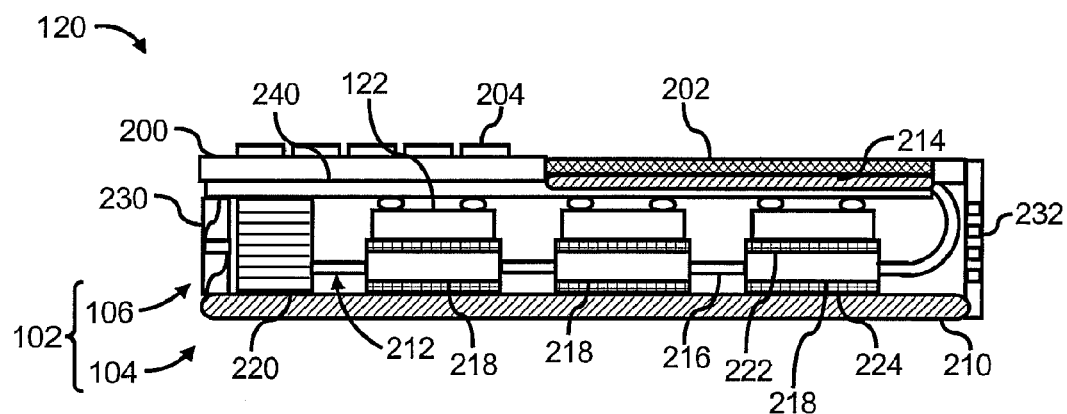
FIGS. 2B and 2C, respectively show cross-sectional side views of the electronic device taken along lines "IIB-IIB" in FIG. 2A, according to embodiments of the invention.

Turning now to FIG. 2B, there is shown a cross-sectional side view of the electronic device 120 taken along lines "IIB-IIB" in FIG. 2A, according to an example. It should be understood that the depiction of the electronic device 120 is a simplified one and that the electronic device 120 will include additional features, such as, for instance, a battery, a speaker, interface mechanisms, wires, etc. Accordingly, the electronic device 120 should not be construed as being limited to the elements depicted in FIG. 2B, but that FIG. 2B merely provides an illustrative example of part of an electronic device 120 configured to implement the cooling system 102 disclosed herein.

As shown in FIG. 2B, the cooling system 102 is encapsulated within a housing 200 of the electronic device 120. The cooling system 102, more particularly, includes the passive cooling device 104 and the active cooling device 106 discussed above with respect to FIG. 1. In addition, FIG. 2B depicts an example of a manner in which the passive cooling device 104 and the active cooling device 106 may be integrated with the other components forming the electronic device 120.

The passive cooling device 104 is depicted as including a number of separate passive cooling devices 210, 212, and 214. According to an example, the first passive cooling device 210 generally comprises a phase-change material (PCM) hermetically sealed in an encapsulation. The PCM may comprise a material, such as wax, that is at a solid state at ambient temperatures, but turns into a liquid at relatively higher temperatures. The temperatures at which the PCM changes phase may be controlled by varying the types of materials used to form the PCM. In addition, the encapsulation may be formed of a heat conductive material, such as metallic foil, configured to both hermetically seal the PCM when it is in liquid form and to cause the PCM to return to its original shape when hardening back into solid form.

The first passive cooling device 210 may form the back cover of the electronic device 120. In this regard, the first passive cooling device 210 may readily transfer heat from within the housing of the electronic device 120 to the environment outside of the housing. It should, however, be understood that the electronic device 120 may include a back cover to protect the first passive cooling device 210, which may be designed to dissipate heat from the first passive cooling device 210. In addition, although the first passive cooling device 210 has been depicted as covering substantially the entire height of the electronic device 120, the first passive cooling device 210 may have a height that is relatively smaller than the electronic device 120 without departing from a scope of the electronic device 120 disclosed herein.

According to an example, the first passive cooling device 210 may be readily replaceable. Thus, for instance, once the first passive cooling device 210 has changed phase from a solid to a liquid and has thus reduced its ability to absorb heat, the first passive cooling device 210 may be removed to be cooled and may be replaced with another first passive cooling device 210.

According to a further example, the encapsulation of the first passive cooling device 210 may be deformable, such that the encapsulation conforms to a user's hand. In this example, for instance, the heat may be dissipated from the first passive cooling device 210 and into the user's hand. In addition, if the electronic device 120 includes a back cover, the back cover may comprise a deformable material.

As shown in FIG. 2B, the second passive cooling device 212 is composed of a conduit 216 and cold plates 218, through which the conduit 216 passes. The second passive cooling device 212 is also depicted as including a heat sink 220, which may be formed of a plurality of fins to thereby increase heat dissipation from the heat sink 220. In operation, a cooling fluid or a phase-change material is supplied through the conduit 216 and absorbs heat from the heat generating components 122 through the cold plates 218.

The heat generating components 122 are depicted as being attached to respective cold plates 218 with a conductive material 222, such as thermally conductive adhesive, paste, strip, etc. Likewise, the cold plates 218 are depicted as being attached to the first passive cooling device 210 with a conductive material 224, such as, thermally conductive adhesive 224. The cold plates 218 are themselves formed of a thermally conductive material, such as, copper, aluminum, or the like. As such, heat generated by the heat-generating components 122 may be conducted through the thermally conductive adhesives 222 and 224, and through the cold plates 218 to be absorbed into the first passive cooling device 210.

The third passive cooling device 214 may also include a PCM encapsulated in a heat conductive material, similar to the first passive cooling device 210. However, as shown in FIG. 2B, the third passive cooling device 214 is positioned behind the screen 202 and may be positioned to absorb heat generated by the display 202. The third passive cooling device 214, may, alternatively be formed of a thermally conductive material, similar to the cold plates 218 and the conduit 216 may be configured to also deliver and remove cooling fluid from the third passive cooling device 214.

According to another example, the second passive cooling device 212 may function as part of the active cooling device 106. In this example, a pump may be provided to pressurize the cooling fluid contained in the conduit 116 to thereby cause the cooling fluid to flow through the cold plates 218 and through the heat sink 220, where heat absorbed into the cooling fluid may be dissipated. In addition, the conduit 216 in this example may be formed into a loop, such that, the cooling fluid may be re-circulated through the cold plates 218 and the heat sink 220 to thereby provide substantially continuous cooling to the heat-generating components 122.

The active cooling device 106 is depicted as also including a fan 230 configured and arranged to supply airflow over the heat sink 220 to thereby substantially enhance dissipation of heat from the heat sink 220. More particularly, and as shown, the fan 230 may be configured to draw air into or out of the housing 200 through openings 232. As such, although the fan 230 has been positioned to supply air across the heat sink 220, the fan 230 may also be configured to supply airflow over the heat-generating components 122 to thereby dissipate heat directly from the heat-generating components 122.

As described in greater detail herein below, the active cooling device 106 including the fan 230 and in certain instances, the second passive cooling device 212, may be activated according to a control scheme designed to substantially minimize power requirements of the active cooling device 106. In this regard, for instance, the fan 230 may be connected to a circuit board 240 to which a controller 110, which may comprise one of the heat-generating components 122, is connected.

Figure 2C:
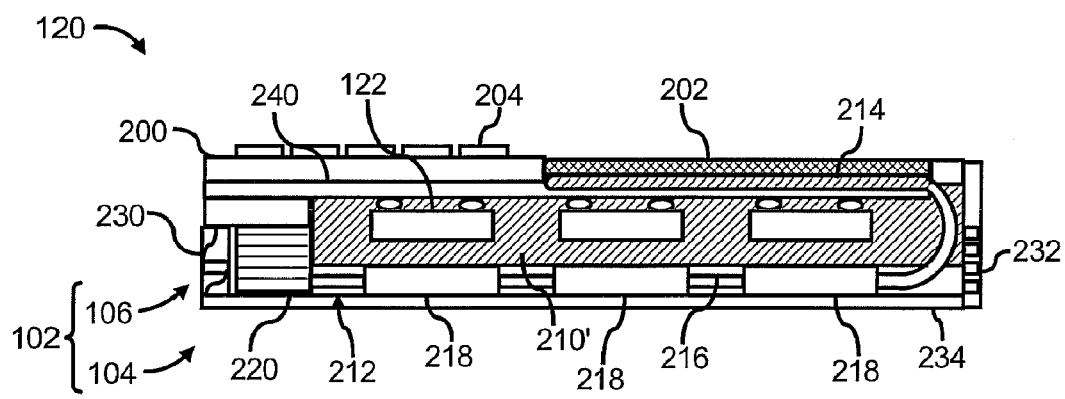

Turning now to FIG. 2C, there is shown a cross-sectional side view of the electronic device 120 taken along lines "IIB-IIB" in FIG. 2A, according to another example. As with FIG. 2B, it should be understood that the depiction of the electronic device 120 is a simplified one and that the electronic device 120 will include additional features and that the electronic device 120 should not be construed as being limited to the elements depicted in FIG. 2C. In addition, FIG. 2C contains many of the same features as discussed above with respect to FIG. 2B. As such, only those features that differ from FIG. 2B will be described.

The major distinction from FIG. 2B is that the first passive cooling device 210' in FIG. 2C is occupies a relatively larger space in the electronic device 120. As shown, the heat-generating components 122 is surrounded by the PCM of the first passive cooling device 210'. In one example, the PCM may be in direct contact with the heat-generating components 122 and the heat-generating components may therefore be capable of operating when the PCM changes to a liquid state. In another example, an impermeable barrier (not shown) may be positioned between the heat-generating components 122 and the PCM. In addition, a back cover 234 may be provided to at least one of hold and protect the components contained in the electronic device 120. The back cover 234 may be rigid or may be flexible as discussed above.

Although the active cooling device 212 has been depicted as being outside of the first passive cooling device 210', the active cooling device 212 may also be positioned within the first passive cooling device 210'. In this example, the first passive cooling device 210' may occupy a substantially larger area within the electronic device 120. In addition, the fan 230 and the heat sink 220 may be positioned cause air to flow through the electronic device 120 in a direction that is substantially perpendicular to that shown in FIG. 2C. Alternatively, gaps may be created through the first passive cooling device 210' to enable air to flow through the electronic device 120.

Figure 2D:
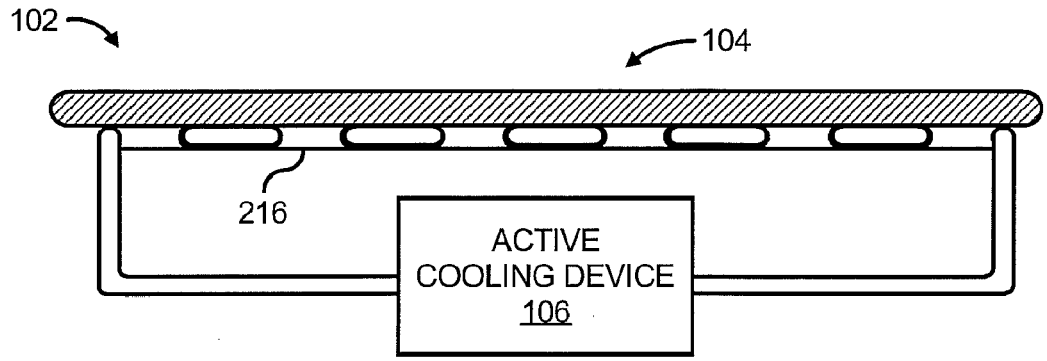
FIGS. 2D-2F, respectively, show configurations depicting various manners in which an active cooling device may be implemented to cool a passive cooling device, according to embodiments of the invention.
Figure 2E:
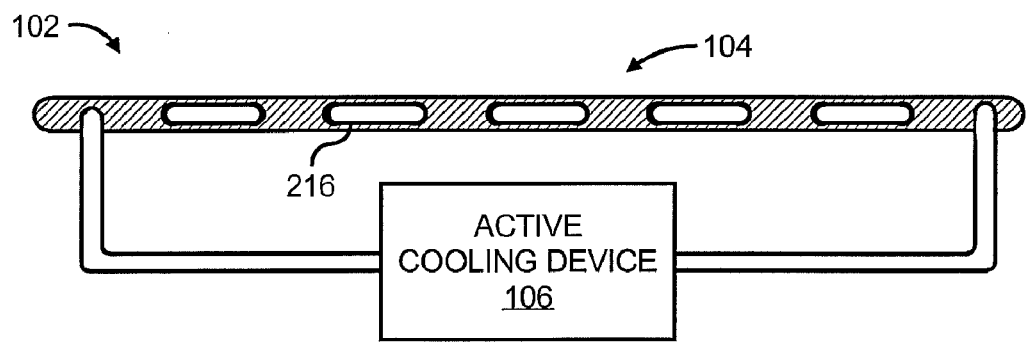
Figure 2F:
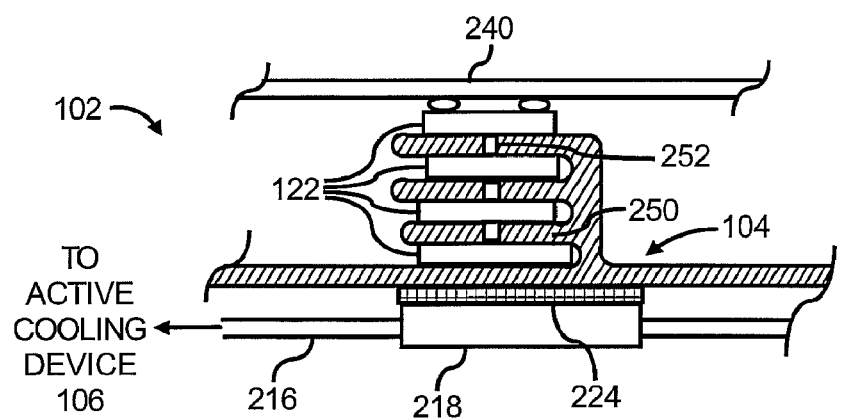

FIGS. 2D-2F show additional examples of various configurations in which the active cooling device 106 is configured and arranged to directly cool the passive cooling device 104.

With reference first to FIG. 2D, there is shown a cross-sectional side view of part of the cooling system 102 in which the active cooling device 106 is configured and arranged to cool the PCM contained in the passive cooling device 104 by cooling an exterior of the passive cooling device 104, according to an example. As shown, the active cooling device 106 includes the conduit 216, which is configured to contact a relatively large surface area of the passive cooling device 104. As such, the conduit 216 may have a substantially "S"-shaped configuration. In addition, the conduit 216 may be arranged, for instance, within an outer casing of the electronic device 120.

With reference now to FIG. 2E, there is shown a cross-sectional side view of part of the cooling system 102, similar to the configuration depicted in FIG. 2D, according to another example. In the cooling system 102 depicted in FIG. 2E, however, the conduit 216 of the active cooling device 106 is depicted as being integrated within the passive cooling device 104. As such, the active cooling device 106 may directly cool, for instance, the PCM contained in the passive cooling device 104 to thereby return the PCM to a solid form.

Turning now to FIG. 2F, there is shown a cross-sectional side view of part of the cooling system 102, according to a further example. As shown in FIG. 2F, a plurality of heat-generating components 122 may be positioned in a stacked arrangement with sections 250 of the passive cooling device 104 extending between the heat-generating components 122. In this arrangement, the sections 250 of the passive cooling device 104 may include openings 252 extending therethrough to generally enable the heat-generating components 122 to communicate with each other or through the circuit board 240. In addition, at least a portion of the passive cooling device 104 may be attached to a cold plate 218 through a thermally conductive adhesive 224. As such, the configuration depicted in FIG. 2F generally enables a plurality of heat-generating components 122, such as, electronic chips, to be arranged in a relatively high density configuration, while providing sufficient cooling to the heat-generating components 122 to enable the relatively high density stacked configuration.

In any of the examples discussed above with respect to FIGS. 2A-2F, the active cooling device 106 may include a pump (not shown) configured to cause cooling fluid, such as, water, refrigerant, etc., to travel through the conduit 216 to absorb heat from either or both of the passive cooling device 104 and the heat-generating components 122. In addition, or alternatively, the active cooling device 106 may comprise a thermoelectric cooling device.

Figure 3:
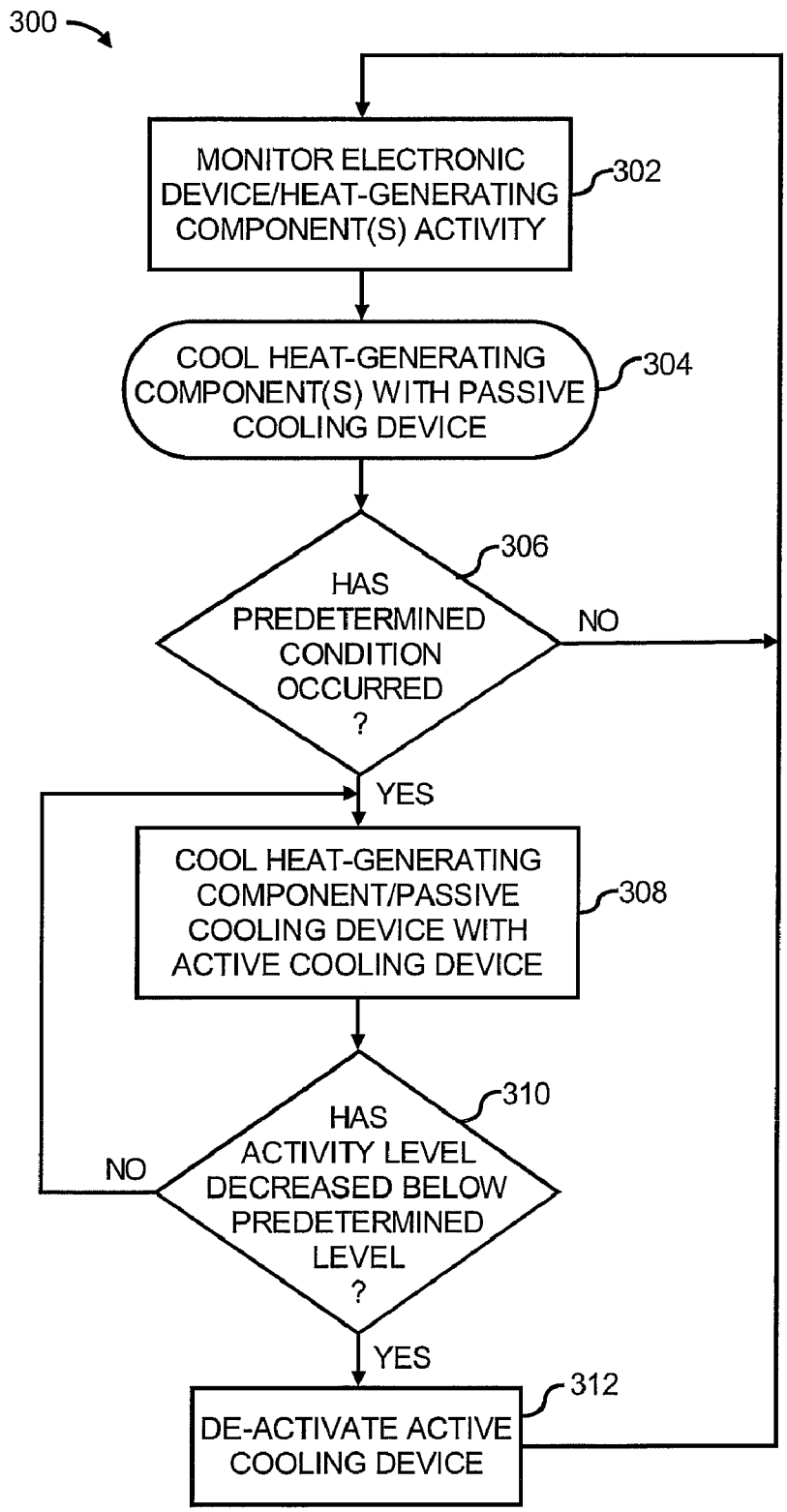
FIG. 3 depicts a flow diagram of a method for cooling an electronic device having at least one heat-generating component, according to an embodiment of the invention.

Various manners in which the cooling system 102 may be implemented will now be described with respect to FIG. 3, which depicts a flow diagram of a method 300 for cooling an electronic device having at least one heat generating component 122, according to an example. It should be understood that the following description of the method 300 is but one manner of a variety of different manners in which such a method 300 may be implemented. In addition, it should be understood that the method 300 may include additional steps and that some of the steps described herein may be removed and/or modified without departing from a scope of the method 300.

The following description of the method 300 is described with particular reference to the components depicted in FIGS. 1 and 2A-2F. It should, however, be understood that the method 300 may be performed by a cooling system whose components differ from or comprise variations of the components depicted in FIGS. 1 and 2A-2F, without departing from a scope of the method 300.

Generally speaking, the method 300 may be implemented by a cooling system 102 housed in an electronic device 120, such as a cellular telephone, a laptop computer, a personal digital assistant, a portable game console, an MP3 player, etc. More particularly, for instance, the controller 110 of the cooling system 102 may implement the method 300 to generally minimize the amount of energy the cooling system 102 uses in cooling the heat-generating components 122 of the electronic device 120.

At step 302, the controller 110 may monitor the electronic device 120 generally or one or more of the heat-generating components 122 more specifically. The controller 110 may monitor the activity by, for instance, monitoring the power states of the heat-generating component(s) 122, the amount of power the heat-generating component(s) 122 are consuming, the power states or power consumption rates of the heat-generating component(s) 122 over time by integrating the area under a curve depicting the power states over time, etc. The power states of the heat-generating component(s) 122 may comprise the power states specified in the Advanced Configuration and Power Interface (ACPI) specification.

In the examples above, the controller 110 may predict when the PCM of the first passive cooling device 210 is near its saturation condition based upon the amount of time the heat-generating component(s) 122 are at a certain power consumption level. In other words, the controller 110 may calculate the amount of heat energy the PCM has absorbed based upon the amount of power the heat-generating generating component(s) 122 has consumed as well as the length of time at which the power was consumed. In addition, the controller 110 may compare that heat energy level to a predetermined heat energy level that the PCM is designed to absorb prior to becoming saturated. The controller 110 may moreover predict when saturation of the PCM is likely to occur and may thus control activation of the active cooling device 214 accordingly.

As another example, the controller 110 may receive information from the input device 114, such as, temperature, activation of the heat-generating component(s) 122, the lengths of time the heat-generating component(s) 122 have been active, etc.

As indicated at step 304, under normal operating conditions, such as, when the passive cooling device 104 is capable of adequately cooling the heat-generating component(s) 122, heat generated by the heat-generating component(s) 122 is absorbed by the passive cooling device 104, to thereby cool the heat-generating component(s) 122. As described above, more than one passive cooling device 104, such as, the passive cooling devices 210 and 212, may be implemented to dissipate heat generated by the heat-generating component(s) 122. While the passive cooling device 104 is cooling the heat-generating component(s) 122, the controller 110 may determine whether a predetermined threshold condition has occurred, as indicated at step 306.

The predetermined threshold condition may comprise, for instance, the passage of a predetermined amount of time since the heat-generating component(s) 122 have been activated, the temperatures of the heat-generating component(s) 122 reaching a predetermined level, the temperature of the passive cooling device 104 reaching a predetermined level, etc. In any of the examples above, the predetermined condition may be predicated upon, for instance, the ability of the passive cooling device 104 to adequately cool the heat-generating component(s) 122. By way of example, the predetermined levels may be based upon the amount of time the PCM in the passive cooling device 104 takes to substantially or completely change phase. In instances where the input device 114 comprises a temperature sensor, the predetermined level may be determined as having occurred if the temperature rises at a predefined rate, which may be indicative of the PCM being unable to absorb additional heat.

As a first example, therefore, where the predetermined threshold condition is the passage of time, the controller 110 may determine that a predetermined threshold condition has occurred if a predetermined amount of time has elapsed since the heat-generating component(s) 122 were activated or otherwise began dissipating heat. As another example, where the predetermined threshold condition is temperature, the controller 110 may determine that a predetermined threshold condition has occurred if the heat-generating component(s) 122 or the passive cooling device 104 reaches a predefined temperature, if the rate at which the temperature of the heat-generating component(s) 122 or the passive cooling device 104 increases exceeds a predefined rate, etc.

If the controller 110 determines that the predetermined condition has not occurred at step 306, the controller 110 may continue to monitor the activity of the electronic device 120/heat-generating component(s) 122 at step 302, which may include enabling the passive cooling device 104 to continue absorbing heat from the heat-generating component(s) 122 at step 304.

If, however, the controller 110 determines that the predetermined condition has occurred at step 306, the controller 110 may activate the active cooling device 106 at step 308 to thereby cool either or both of the heat-generating component(s) 122 and the passive cooling device 104, in one or more various manners as described above. According to another example, the controller 110 may attempt to delay activation of the active cooling device 106 at step 308 by, for instance, substantially balancing performance of the heat-generating component(s) 122 and the active cooling device 106. In other words, the controller 110 may reduce the amount of heat dissipated by the heat-generating component(s) 122 by reducing their performance levels. For instance, the controller 110 may cause a low-resolution video to be displayed instead of a high resolution display, the controller 110 may reduce or deactivate the display 202, etc.

According to an example, the controller 110 may receive instructions from a user regarding the level of heat generated by the heat-generating component(s) 122. For instance, the user may select a power conservation mode, in which the controller 110 deactivates that display 202 or outputs low-resolution video, etc. The user may also select a high power mode, in which the controller 110 maximizes performance while sacrificing energy conservation.

After activating the active cooling device 106, the controller 106 may continue to monitor the activity level, for instance, by continuing to monitor the information received from the input device 114. While monitoring the activity level, the controller 110 may determine whether the activity level has decreased below a predetermined level at step 310. The predetermined level may be based upon, for instance, the temperatures of the heat-generating component(s) 122, the temperature of the passive cooling device 104, the length of time the active cooling device 106 has been active, etc. Again, the predetermined level may be predicated upon the ability of the passive cooling device 104 to adequately dissipate heat generated by the heat-generating component(s) 122.

If the activity level has not decreased below the predetermined level at step 310, the controller 110 may continue to cool either or both of the heat-generating component(s) 122 and the passive cooling device 104 with the active cooling device 106. According to an example, the controller 110 may activate the active cooling device 106 to its maximum operating level during a first iteration of step 306. According to another example, however, the controller 110 may gradually increase the operating level of the active cooling device 106, for instance, as the length of time the heat-generating component(s) 122 are active. In this example, the controller 110 may increase the active cooling device 106 operating level during each iteration of steps 308 and 310 until the active cooling device 106 has reached its maximum operating level or until the heat-generating(s) 122 become inactive. By way of example, the controller 110 may operate the fan 230 at a low level for a predetermined amount of time and may increase the fan 230 operating level as the heat-generating component(s) 122 continues to generate heat. The controller 110 may increase the fan 230 operating level in either of a continuous or a stepped manner depending upon a configuration of the fan 230 control system.

If one or more attempts at cooling the heat-generating component(s) 122 are unsuccessful, which may be an indication that the heat-generating component(s) 122 are operating at relatively high levels, the controller 110 may initiate a controlled shutdown procedure of the electronic device 120. The controlled shutdown procedure may include automatically backing up or saving current settings and then shutting down the electronic device 120. As such, the electronic device 120 may be shutdown in a manner that enables a user to substantially easily restore the settings on the electronic device 120.

If, however, the activity level has decreased below the predetermined level at step 310, the controller 110 may de-activate the active cooling device 106. In addition, the controller 110 may continuously implement the method 300 such that the amount of energy required to cool the heat-generating component(s) 122 may substantially be minimized, while still providing adequate cooling.

By way of a particular example in which the electronic device 120 comprises a cellular telephone, the passive cooling device 104 may be sufficient to adequately cool the heat-generating component(s) 122 during short duration calls and the active cooling device 106 may be used when the calls exceed a predetermined amount of time. As another example, the passive cooling device 104 may be sufficient to cool the heat-generating component(s) 122 during calls and texting sessions, however, the active cooling device 106 may be activated when the cellular telephone is employed to display video. In this regard, the amount of power required from the battery to cool the heat-generating component(s) 122 may substantially be minimized.

Some of the operations set forth in the method 300 may be contained as a utility, program, or subprogram, in any desired computer accessible medium. In addition, the method 300 may be embodied by a computer program, which may exist in a variety of forms both active and inactive. For example, it can exist as software program(s) comprised of program instructions in source code, object code, executable code or other formats. Any of the above may be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A method for cooling a heat-generating component in an electronic device with a cooling system having a passive cooling device and an active cooling device, said passive cooling device comprising a phase change material that is in a solid state at a first range of temperatures and melts into a liquid state at a predetermined temperature, said phase change material having a cooling ability designed to substantially expire after a predetermined amount of heat is absorbed from the heat-generating component, and wherein the active cooling device requires electrical energy to provide cooling and the passive cooling device requires no electrical energy to provide cooling, said method comprising:

determining, by a processor, that a predetermined threshold condition has occurred, wherein the predetermined threshold condition indicates that the cooling ability of the passive cooling device has expired, wherein the passive cooling device is to cool the heat-generating component without operation of the active cooling device until the predetermined threshold condition occurs; and activating, by the processor, the active cooling device in response to a determination that the predetermined threshold condition has occurred to dissipate heat generated by the heat-generating component and cool the passive cooling device when the active cooling device is activated, and wherein the active cooling device is to dissipate heat directly from the heat-generating component without the heat being first directed through the passive cooling device.

2. The method according to claim 1, further comprising:

determining whether the level of heat generated by the heat-generating component has decreased below a predetermined level; and de-activating the active cooling device in response to a determination that the level of heat generated by the heat-generating component has decreased below the predetermined level.

3. The method according to claim 1, wherein activating the active cooling device further comprises gradually increasing a power consumption level of the active cooling device as the heat-generating component continues to generate heat.

4. The method according to claim 1, further comprising:
monitoring activity of the heat-generating component by monitoring at least one of a heat-generating component power state, a power consumption level of the heat-generating component, a power consumption level of the heat-generating component, and a temperature over time; and
wherein determining that a predetermined threshold condition has occurred further comprises determining that a predetermined threshold condition has occurred based upon the monitored activity.

5. The method according to claim 1, further comprising:
balancing performance of the heat-generating component and the active cooling device to reduce a power consumption level of the active cooling device.

6. The method according to claim 5, wherein balancing performance further comprises receiving user input regarding a selected mode of operation and balancing performance of the heat-generating component and the active cooling device according to the user input.

7. The method according to claim 1, further comprising:
removing the passive cooling device following the cooling ability of the passive cooling device to cool the heat-generating component having substantially expired.

8. The method according to claim 7, further comprising:
replacing the removed passive cooling device with another passive cooling device.

9. A non-transitory computer readable storage medium on which is stored machine readable instructions that when executed by a processor implement a method for cooling a heat-generating component in an electronic device with a cooling system having a passive cooling device and an active cooling device, said passive cooling device comprising a phase change material that is in a solid state at a first range of temperatures and melts into a liquid state at a predetermined temperature, said phase change material having a cooling ability designed to substantially expire after a predetermined amount of heat is absorbed from the heat-generating component, and wherein the active cooling device requires electrical energy to provide cooling and the passive cooling device requires no electrical energy to provide cooling, said machine readable instructions comprising code to:
determine that a predetermined threshold condition has occurred, wherein the predetermined threshold condition indicates that the cooling ability of the passive cooling device has expired, wherein the passive cooling device is to cool the heat-generating component without operation of the active cooling device until the predetermined threshold condition occurs; and
activate the active cooling device in response to a determination that the predetermined threshold condition has occurred to dissipate heat generated by the heat-generating component and cool the passive cooling device when the active cooling device is activated, and wherein the active cooling device is to dissipate heat directly from the heat-generating component without the heat being first directed through the passive cooling device.

10. The non-transitory computer readable storage medium according to claim 9, wherein the machine readable instructions further comprise code to:
determine whether the level of heat generated by the heat-generating component has decreased below a predetermined level; and
de-activate the active cooling device in response to a determination that the level of heat generated by the heat-generating component has decreased below the predetermined level.

11. The non-transitory computer readable storage medium according to claim 9, wherein the machine readable instructions further comprise code to:
activate the active cooling device by gradually increasing a power consumption level of the active cooling device as the heat-generating component continues to generate heat.

12. The non-transitory computer readable storage medium according to claim 9, wherein the machine readable instructions further comprise code to:
monitor at least one of a heat-generating component power state, a power consumption level of the heat-generating component, a power consumption level of the heat-generating component, and a temperature over time; and
determine that a predetermined threshold condition has occurred based upon the monitored activity.

13. The non-transitory computer readable storage medium according to claim 9, wherein the machine readable instructions further comprise code to:
balance performance of the heat-generating component and the active cooling device to reduce a power consumption level of the active cooling device.

14. The non-transitory computer readable storage medium according to claim 13, wherein the machine readable instructions further comprise code to:
receive user input regarding a selected mode of operation and balance performance of the heat-generating component and the active cooling device according to the user input.

* * * * *